(12) United States Patent
Fan et al.

(10) Patent No.: US 7,216,422 B2
(45) Date of Patent: May 15, 2007

(54) METHOD OF FORMING A CAPACITOR ASSEMBLY IN A CIRCUIT BOARD

(75) Inventors: Jun Fan, Escondido, CA (US); James L. Knighten, Poway, CA (US); Arthur R. Alexander, Valley Center, CA (US); Norman W. Smith, San Marcos, CA (US)

(73) Assignee: NCR Corp., Dayton, OH (US)

( * ) Notice: Subject to any disclaimer, the term of this patent is extended or adjusted under 35 U.S.C. 154(b) by 0 days.

(21) Appl. No.: 11/007,010

(22) Filed: Dec. 8, 2004

(65) Prior Publication Data

US 2005/0098346 A1 May 12, 2005

Related U.S. Application Data

(62) Division of application No. 10/287,116, filed on Nov. 4, 2002, now Pat. No. 6,844,505.

(51) Int. Cl.
*H05K 3/30* (2006.01)

(52) U.S. Cl. ............................ 29/832; 29/833; 29/834; 29/852; 29/840; 174/260; 361/763

(58) Field of Classification Search ................ 29/852, 29/832–834, 842, 840, 25.35; 174/255, 262; 361/734, 744, 783, 811, 792, 795; 228/180.21, 228/180.22
See application file for complete search history.

(56) References Cited

U.S. PATENT DOCUMENTS

| 4,436,953 | A | * | 3/1984 | Gottlieb ..................... 174/72 B |
|---|---|---|---|---|
| 4,800,459 | A | * | 1/1989 | Takagi et al. ............. 361/321.2 |
| 5,027,253 | A | | 6/1991 | Lauffer et al. |
| 5,261,153 | A | | 11/1993 | Lucas |
| 5,796,587 | A | | 8/1998 | Lauffer et al. |
| 5,953,203 | A | | 9/1999 | Tormey et al. |
| 6,068,782 | A | | 5/2000 | Brandt et al. |
| 6,252,761 | B1 | * | 6/2001 | Branchevsky ............. 361/321.2 |
| 6,256,850 | B1 | | 7/2001 | Lauffer et al. |
| 6,329,590 | B1 | | 12/2001 | Alexander et al. |
| 6,407,929 | B1 | | 6/2002 | Hale et al. |
| 6,844,505 | B1 | * | 1/2005 | Fan et al. .................... 174/260 |
| 6,983,535 | B2 | * | 1/2006 | Crockett et al. .............. 29/832 |
| 6,998,308 | B2 | * | 2/2006 | Ooi et al. .................... 438/253 |

OTHER PUBLICATIONS

U.S. Appl. No. 10/630,886, filed Jul. 30, 2003, Alexander et al.
U.S. Appl. No. 10/670,829, filed Sep. 25, 2003, Jun Fan et al.

* cited by examiner

*Primary Examiner*—Minh Trinh
(74) *Attorney, Agent, or Firm*—Trop, Pruner & Hu P.C.; Harden E. Stevens, III

(57) ABSTRACT

A circuit board includes an assembly having first and second power reference plane layers, and an insulator layer between the first and second power reference plane layers. Discrete decoupling capacitors are further provided with the assembly. Additional layers are provided above and below the assembly.

3 Claims, 10 Drawing Sheets

METHOD OF FORMING A CAPACITOR ASSEMBLY IN A CIRCUIT BOARD

CROSS-REFERENCE TO RELATED APPLICATIONS

This application claims priority from and is a divisional patent application of U.S. patent application Ser. No. 10/287,116, filed Nov. 4, 2002, now U.S. Pat. No. 6,844,505.

BACKGROUND

A circuit board (sometimes referred to as a printed circuit board or a printed wiring board) is the basic building block for interconnecting electronic devices in a system. Electronic devices, usually integrated circuit (IC) devices, are mounted onto the circuit boards using a number of mounting mechanisms, such as by use of connectors or by directly mounting the devices onto a surface of the circuit board. A circuit board also includes the wiring required to interconnect the devices electrically.

The number and density of signal lines in a circuit board are continuously increasing due to the increased density of circuits that can be formed on each IC chip. The number of input/output (I/O) pins that exist on each IC chip can be quite large, which means that a large number of signal wires are needed to carry signals from one IC chip to another component in the system. To increase the density of signal wires that can be provided in the circuit board, a circuit board is usually formed of multiple layers. Some layers contain signal wires for transmitting signals, while other layers contain power reference planes, which are connected to ground or to a power supply voltage, e.g., a three-volt voltage, a five-volt voltage, or some other power supply voltage. In other arrangements of circuit boards, power reference planes are not used. To connect signal wires in different layers of the circuit board, vias are provided. A via is an electrical connection that is run through multiple layers of the circuit board to complete a signal path using different layers, or to provide an electrical connection to ground or power. Typically, the via is run generally perpendicularly to a main surface of the circuit board.

With large numbers of IC chips and signal wires (I/O circuits) in a circuit board, switching noise can be a problem during system operation, especially at high frequencies. To mitigate switching noise, surface mount technology (SMT) decoupling capacitors are commonly used. These capacitors are mounted to either the primary or secondary (top or bottom) surface of the circuit board, and connected to reference planes through vias. At high frequencies, a capacitor provides a low impedance bypass path for switching noise between the power supply voltage plane and the ground plane.

One issue associated with connecting decoupling capacitors to reference planes is the relatively high inductance resulting from the combination of the capacitor's package, a via, and the interconnecting structure from the decoupling capacitor to the via. As frequencies increase into the hundreds of megahertz (MHz) or gigahertz (GHz) range, the impedance associated with the combined inductance of each decoupling capacitor circuit becomes much larger than the capacitive impedance associated with the decoupling capacitor itself. To reduce the package inductance, surface mount technology (SMT) capacitors are used. To reduce the interconnection inductance, low-inductance interconnections are used, such as short wires, wide interconnects, multiple vias, and so forth. Nevertheless, because of the increased impedance caused by the inductance of the via, the SMT decoupling capacitor is unable to effectively provide a low-impedance bypass path for switching noise at high frequencies. In other words, because of a significant impedance introduced by the via inductance into the decoupling path, a capacitor loses its decoupling effectiveness in providing a bypass path for high frequency noise.

Other techniques have also been employed to provide decoupling capacitance in circuit boards. For example, an embedded capacitance in a circuit board has been employed to avoid effects of via inductances. However, conventional embedded capacitance techniques are typically associated with relatively low capacitance, which means increased impedance at high frequencies. Without effective decoupling, switching noise on a circuit board can cause device operation to fail under certain conditions.

SUMMARY

In general, enhanced mounting techniques and mechanisms for decoupling capacitors are provided in a circuit board to improve decoupling characteristics. For example, a circuit board includes a core assembly having first and second power reference plane layers, an insulator layer between the power reference plane layers, and discrete capacitors each abutting one of the first and second power reference plane layers. Additional layers are provided above and below the core assembly.

Other or alternative features will become more apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments are possible.

Figure 1:
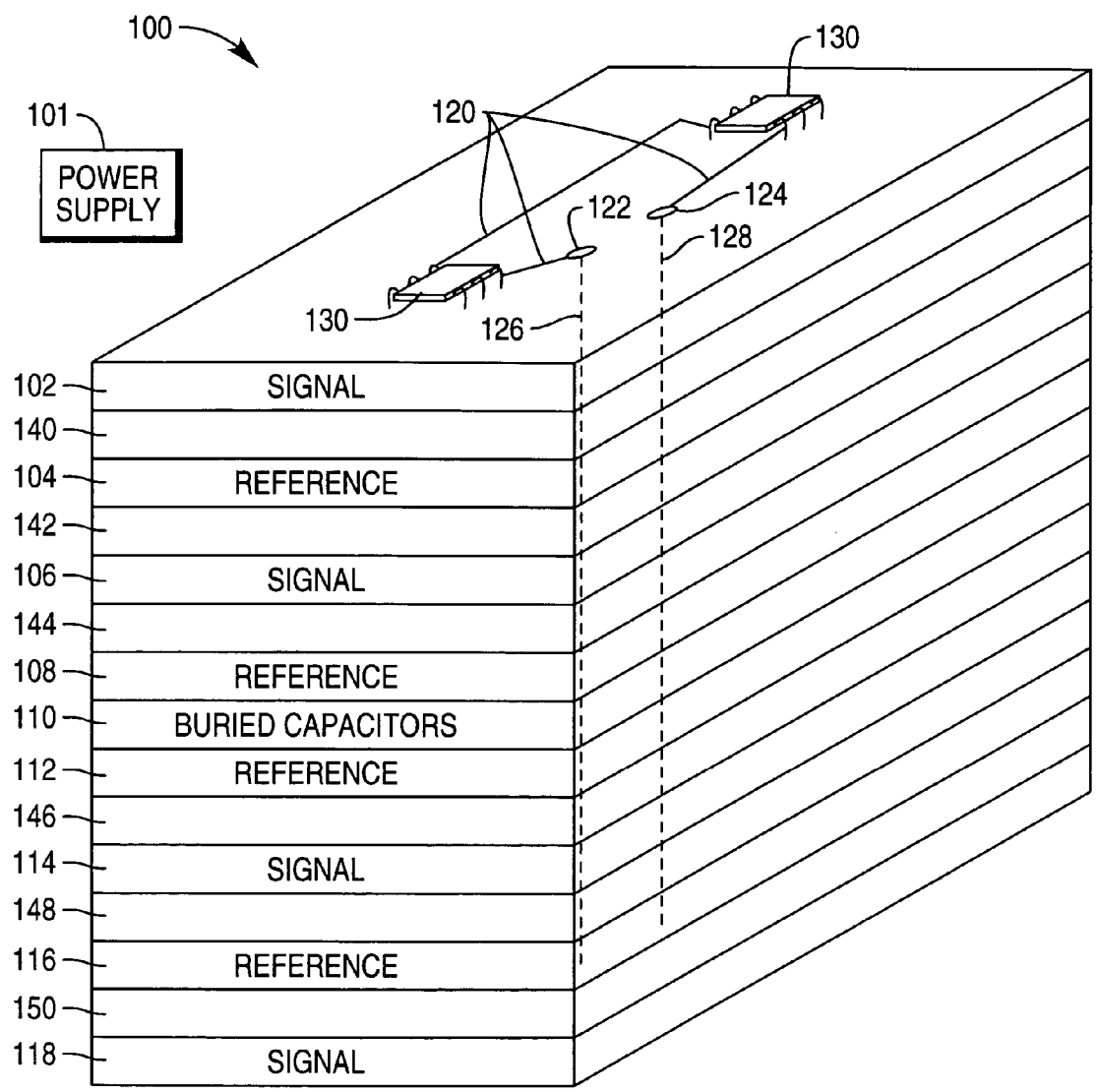
FIG. 1 illustrates an example arrangement of a circuit board that includes buried, discrete decoupling capacitors.

As shown in FIG. 1, an example circuit board 100 includes multiple layers 102, 104, 106, 108, 112, 114, 116, and 118. In other embodiments, a larger or smaller number of layers can be used in the circuit board. As used here, a "circuit board" refers to any structure containing signal wires or conductors (for routing signals) and containing power reference planes (to carry ground and power supply voltages). Examples of a "circuit board" include printed wiring boards (PWBs) and printed circuit boards (PCBs). A "circuit board" also covers any package, such as an integrated circuit (IC) package, that has multiple layers of signal wires or conductors and power reference planes. The circuit board 100 is part of a system that includes various components, such as a hard disk drive, a display, a central processing unit (CPU), a power supply 101, and so forth. The components (e.g., devices 130) are mounted on one surface (or both a top and bottom surface) of the circuit board 100.

In the example shown in FIG. 1, the layers 102, 106, 114, and 118 are signal layers for carrying signal wires, while the layers 104, 108, 112, and 116 are power reference plane layers that contain either a ground plane or a power supply voltage plane connected to a power supply voltage, (e.g., 3 volts, 5 volts, 12 volts, etc.) produced by the power supply 101. Dielectric layers 140, 142, 144, 110, 146, 148, and 150 are provided between successive signal and/or reference plane layers. The dielectric layers are insulator layers to isolate electrical conductors in the circuit board.

The dielectric layer 110 contains multiple decoupling capacitors to provide a bypass path for switching noise between a power supply voltage plane and ground plane. Thus, in the example of FIG. 1, one of the reference layers 108 and 112 is a ground reference layer, while the other one of the reference layers 108 and 112 is a power supply voltage reference layer. The decoupling capacitors in the dielectric layer 110 each has electrodes that are electrically coupled to the power reference layers 108 and 112.

Although only one assembly of the dielectric layer 110 with embedded decoupling capacitors is shown in FIG. 1, other embodiments may utilize additional such layers with embedded decoupling capacitors. For example, to be more effective, the assembly of the dielectric layer 110 with embedded capacitors is placed close to active devices mounted on one side of the circuit board. Another assembly of a dielectric layer with embedded capacitors is placed close to active devices on the other side of the circuit board.

Further, as shown in FIG. 1, devices 130 are mounted on a planar surface of the circuit board 100. Signal traces 120 in the layer 102 route signals from the devices 130 to other points on the circuit board 100. Some of the signal traces 120 connect input/output (I/O) pins of the devices 130 to via pads 122 and 124. The via pads 122 and 124 are in turn connected to vias 126 and 128, respectively, which are passed generally vertically through the multiple layers of the circuit board 100.

Although vias are used to connect signal wires, such vias (which have associated inductances) are not used to connect decoupling capacitors between power reference planes. Instead, buried discrete capacitors in the dielectric layer 110 are electrically contacted to the reference planes 108 and 112 to provide low impedance bypass paths (at high frequencies) for switching noise. In accordance with some embodiments of the invention, the electrical contact between electrodes of the buried capacitors and the reference plane layers are associated with much lower inductances than inductances of standard vias used to connect the signal wires. In some embodiments, the electrical contact between the decoupling capacitors and the reference planes 108 and 112 is implemented with micro-vias, which are very small vias of short lengths to electrically contact one electrical component to another electrical component. Due to their much shorter length, micro-vias have much smaller inductances than standard vias. In other embodiments, other types of low-inductance electrical contact can be used for electrically contacting the buried decoupling capacitors in the layer 110 to the reference plane layers 108 and 112. The low inductance of the electrical contact between the capacitor electrodes and the power reference planes allows provision of the low impedance bypass path through the decoupling capacitors for high-frequency noise.

Figure 2:
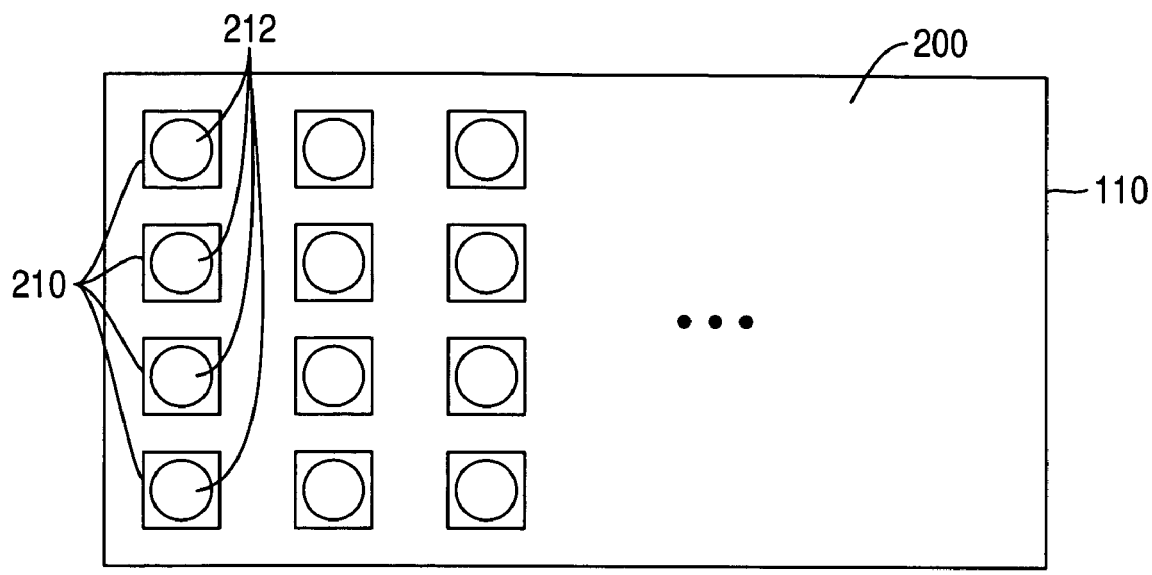
FIG. 2 illustrates openings formed through a dielectric layer, in accordance with an embodiment.

FIG. 2 shows a top view of the dielectric layer 110. The dielectric layer 110 has a top planar surface 200. Although not shown in FIG. 2, the dielectric layer 110 also has a bottom planar surface, which is on the opposite side of the dielectric layer 110 from the top surface 200. A plurality of openings 210 are formed through the dielectric layer 110. The openings (or holes) are formed to extend from the top or main surface 200 of the dielectric layer to the bottom surface of the dielectric layer such that the opening passes through the entire thickness of the dielectric layer 110. In the embodiment shown in FIG. 2, each opening runs along a direction that is generally perpendicular to the top surface 200 of the dielectric layer 110. Although shown as being generally rectangular or square in shape, the openings 210 can have other of shapes, such as circular, oval, triangular, and so forth. Discrete decoupling capacitors 212 are provided in the openings 210.

The discrete openings 210 in the dielectric layer 110 enable the provision of discrete capacitors 212 in the layer 110. In one embodiment, the type of discrete capacitors used is of the surface mount technology (SMT) type. As used here, SMT refers to the type of capacitor used, not to the mounting mechanism of the capacitor. In fact, the SMT capacitors 212 are buried within an inner layer of the circuit board and not mounted to an external surface of the circuit board. A benefit of using SMT capacitors is that they can be "off-the-shelf" discrete IC components that are easily available. Each of such off-the-shelf capacitors has an outer package or protective housing to surround the capacitor components. Electrodes protrude from the package to enable connection of each discrete capacitor to other components. In other embodiments, other types of discrete capacitors are used (e.g., round or circular capacitors). The term "discrete capacitors" generally refers to capacitors that have separate electrodes and dielectric layers—in other words, two capacitors are discrete if they do not share any of their electrodes and dielectric layer with another capacitor.

In yet other embodiments, the discrete capacitors are formed by depositing electrode layers and the capacitor dielectric layer in each opening 210 of the layer 110.

Figure 4:
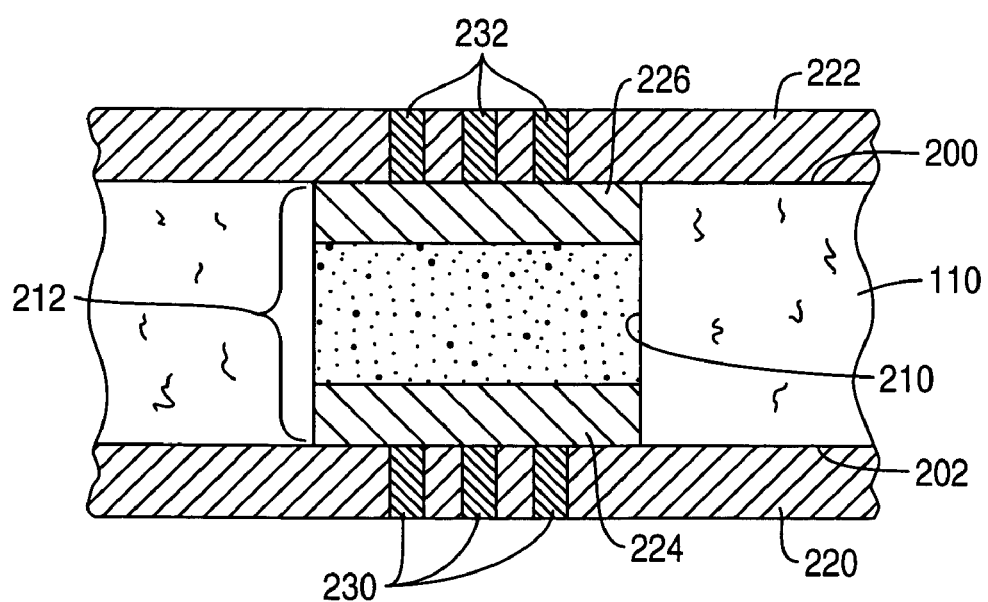
FIG. 4 is a cross-sectional view of a core assembly according to one embodiment for use in the circuit board of FIG. 1.
Figure 3:
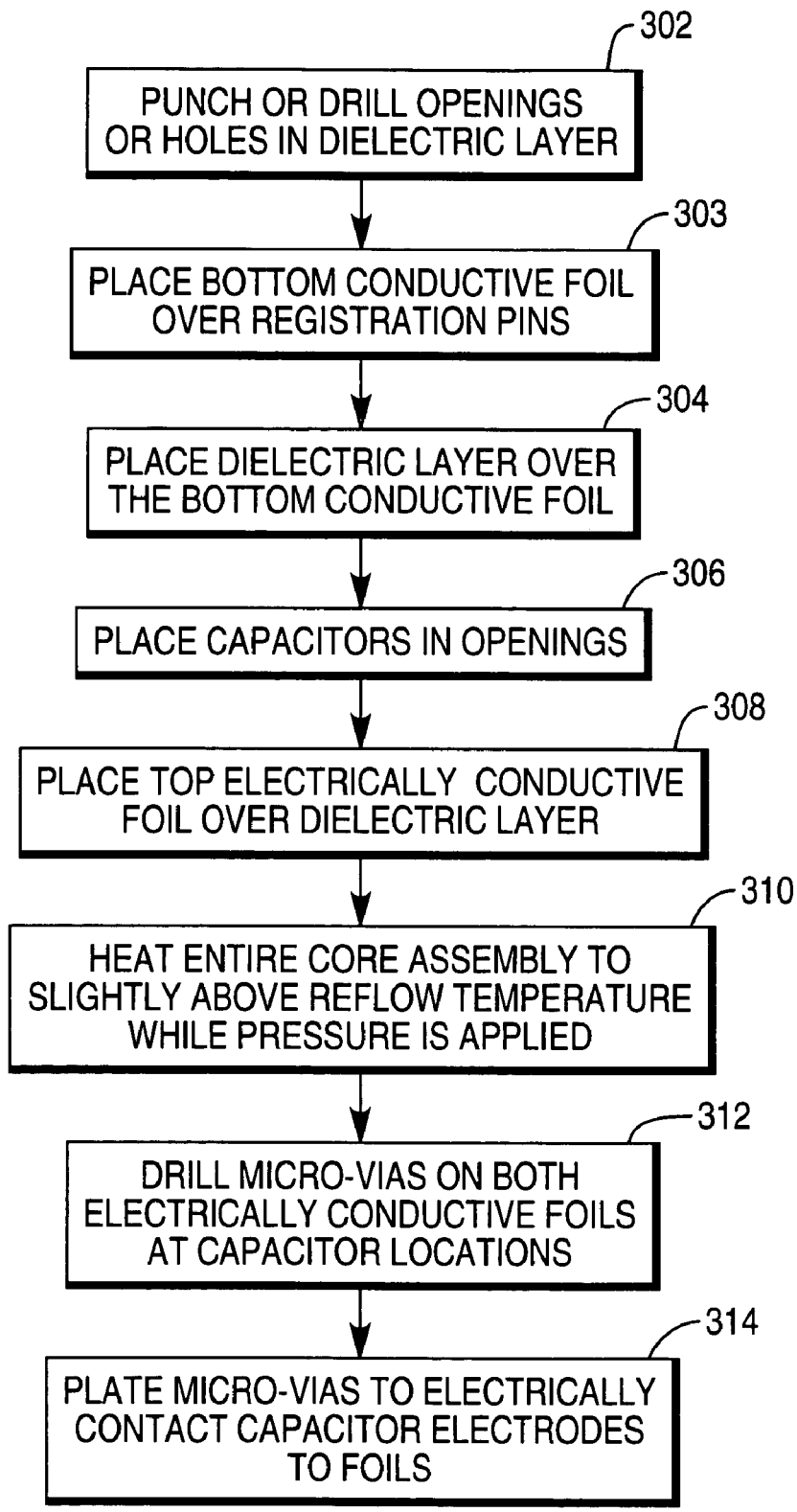
FIG. 3 is a flow diagram of a process according to one embodiment of building a core assembly for use in the circuit board of FIG. 1.

FIG. 3 shows a process according to an embodiment for building a core assembly that includes the dielectric layer 110 with openings in which are fitted decoupling capacitors. The core assembly also includes electrically conductive foils 220 and 222 (FIG. 4) on both sides of the dielectric layer 110. As examples, the electrically conductive foils 220 and 222 are copper or other electrically conductive foils. According to the process of FIG. 3, openings or holes have previously been punched, drilled, or otherwise formed in the dielectric layer (at 302). The bottom electrically conductive foil 220 is placed (at 303) over registration pins, which are structures used to align the multiple layers that make up the assembly. Next, the dielectric layer 110 is placed (at 304)

over the bottom electrically conductive foil using the same or a different registration mechanism.

Next, the discrete capacitors 212 are placed (at 306) in the openings 210 of the dielectric layer 110. The top electrically conductive foil 222 is then placed (at 308) on the top surface 200 of the dielectric layer 110 such that the top electrically conductive foil 222 abuts or contacts the top surface 200 of the dielectric layer 110. A registration mechanism is also used to properly locate the top conductive foil with respect to the remainder of the assembly. Note that the top and bottom foils 222 and 220 are separate from the electrodes of the capacitor. In fact, the foils 220 and 222 make up the power reference planes.

The core assembly of the dielectric layer 110, top and bottom electrically conductive foils 220 and 222, and capacitors 212 is then heated (at 310) to slightly above reflow temperature (of the dielectric material in the layer 110). This causes the dielectric material in the layer 110 to flow and bond to the electrically conductive foils 220 and 222. While the core assembly is heated, pressure is applied to the top and bottom foils 220 and 222 to form the bond between the foils 220 and 222 and the respective surfaces of the dielectric layer 110. To form the electrical contact between each foil 220 and 222 and respective electrodes 224 and 226 of the capacitors 212, micro-vias 230 and 232 are drilled or otherwise formed (at 312) in both the top and bottom electrically conductive foils 220 aid 222. After the micro-vias are drilled, the micro-vias are plated (at 314) to electrically contact the capacitor electrodes 224 and 226 to the foils 220 and 222, respectively.

After the process performed in FIG. 3, a core assembly has been built that contains the dielectric layer with buried, discrete decoupling capacitors and top and bottom electrically conductive foils that can be electrically connected to power reference planes (a ground reference plane and a power supply voltage reference plane) of a circuit board, such as the circuit board 100 shown in FIG. 1. In some circuit boards, only one core assembly per circuit board is needed. In other cases, multiple core assemblies can be implemented into a circuit board.

Figure 5A:
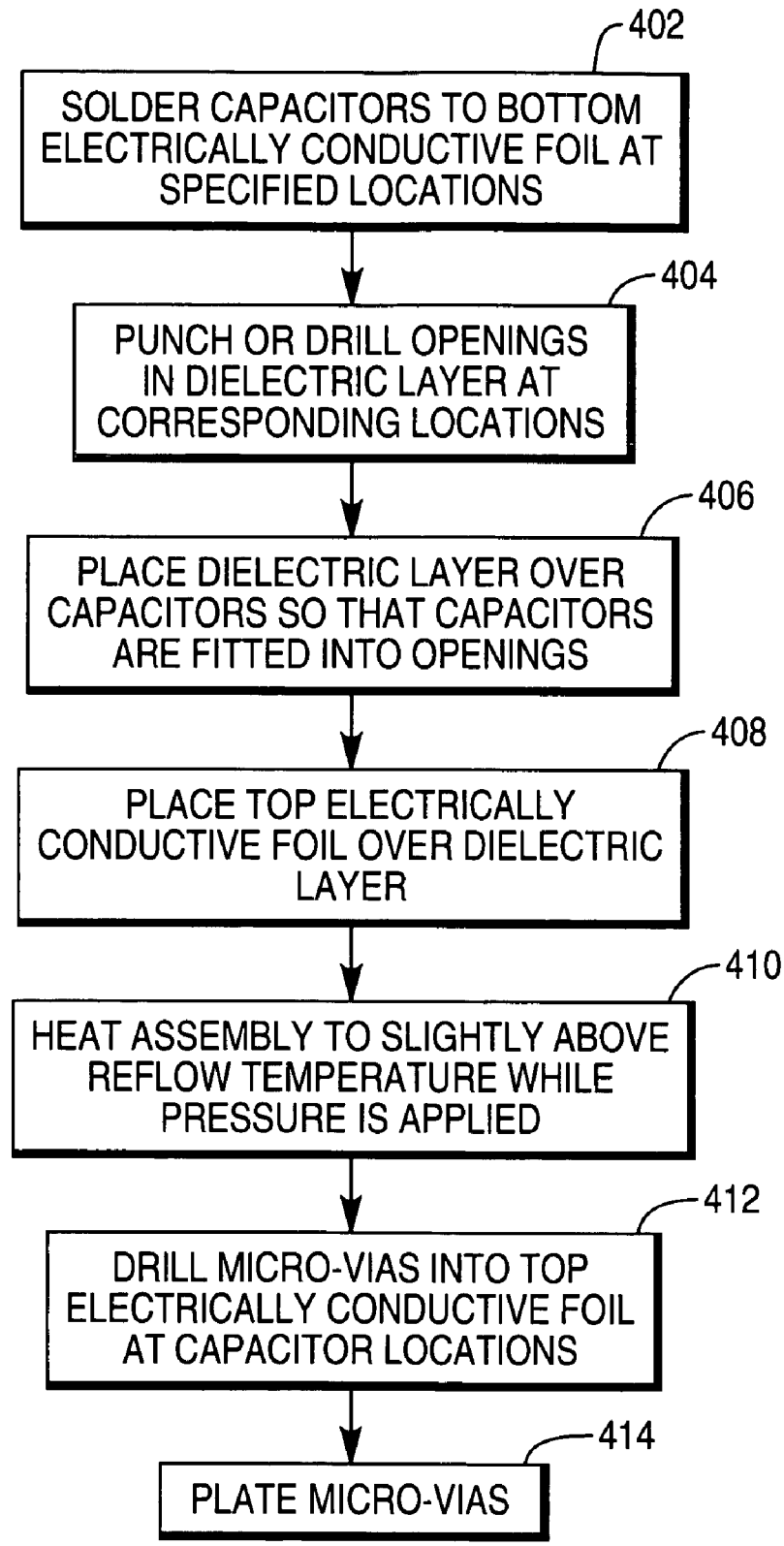
FIG. 5A is a flow diagram of a process according to another embodiment of building a core assembly for use in the circuit board.

FIG. 5A shows another embodiment of forming the core assembly. In this other embodiment, the decoupling capacitors 212 are soldered (at 402) to the bottom electrically conductive foil 220 at specified locations. Next, openings are punched or drilled (at 404) in the dielectric layer 110 at locations corresponding to the capacitor locations on the bottom electrically conductive foil 220. The dielectric layer 110, with the openings 210 formed therein, is then placed (at 406) over the capacitors that are soldered to the bottom electrically conductive foil 220. Next, the top electrically conductive foil 222 is placed (at 408) over the dielectric layer. The assembly is then heated (at 410) to slightly above reflow temperature while pressure is applied. Micro-vias are then drilled (at 412) into the top electrically conductive foil 222 at the capacitor locations. The micro-vias are then plated (at 414) to electrically contact the top electrically conductive foil 222 to the electrodes 226 of corresponding capacitors 212.

In yet another process according to a different embodiment, holes or openings are first punched or drilled into the dielectric layer 110 at capacitor locations. Then, the bottom electrically conductive foil 220 is placed under the dielectric layer 110, with capacitors placed into the openings 210 of the dielectric layer 110. Next, the top electrically conductive foil 222 is placed onto the top surface of the dielectric layer 110. The whole assembly is then heated to slightly above reflow temperature while pressure is applied. In this different embodiment, electrical contact of the foils 220 and 222 to electrodes of the capacitor 212 is maintained by compression. The compression is maintained by the board lamination process of "gluing" or bonding the dielectric layer 110 to the electric foils 220 and 222 by the reflow of the dielectric material under pressure. The printed circuit board manufacturing process eliminates air and other gases that may be present or may have been introduced to the core assembly that would reduce the effectiveness of the compression electrical contact between the foils and capacitor electrodes.

Figure 5B:
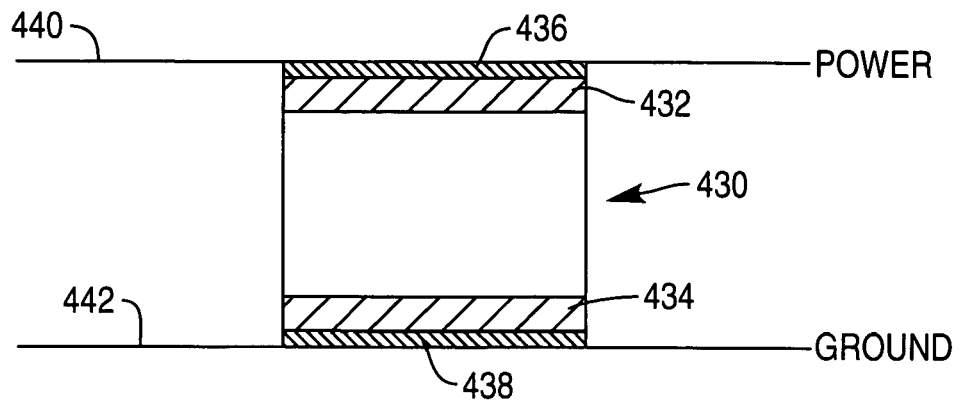
FIGS. 5B–5D illustrate various arrangements to enhance contact prints between a decoupling capacitor and power reference plane layers.

In the embodiment in which electrical contact between the foils and the capacitor electrodes are maintained by compression, the electrical contact is enhanced by forming irregular contact surfaces to provide a roughened profile. As shown in FIG. 5B, a capacitor 430 has a first electrode 432 and a second electrode 434. The upper surface 436 of the electrode 432 is formed to have an irregular pattern so that high points are provided to provide high-pressure points when an upper electrically conductive foil 440 is contacted to the electrode surface 436. Similarly, a lower surface 438 of the electrode 434 is formed to have an irregular pattern to provide better electrical contact points with a lower electrically conductive foil.

Figure 5C:
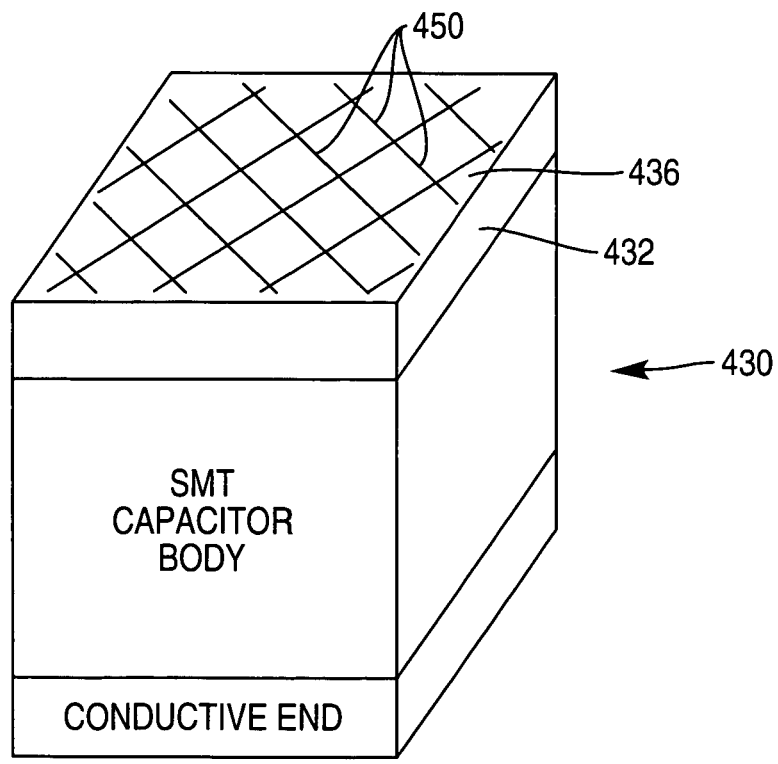

In one arrangement, as shown in FIG. 5C, a pattern 450 is formed on the upper surface 436 of the electrode 432. A similar pattern (not shown) is formed on the lower surface. The pattern 450 is formed by scoring, etching, or by some other suitable techniques. One example etching technique involves placing a mask with predefined openings in the mask to allow desired portions of the electrode surface 436 to be etched by a chemical agent, by plasma, or by some other agent. Alternatively, a dendritic plating technique is employed to form the pattern 450 on the electrode surface 436. In yet another alternative technique, mechanical interruption is employed to form the pattern 450, such as with use of a cutter or the like to cut the pattern 450 into the surface 436.

Figure 5D:
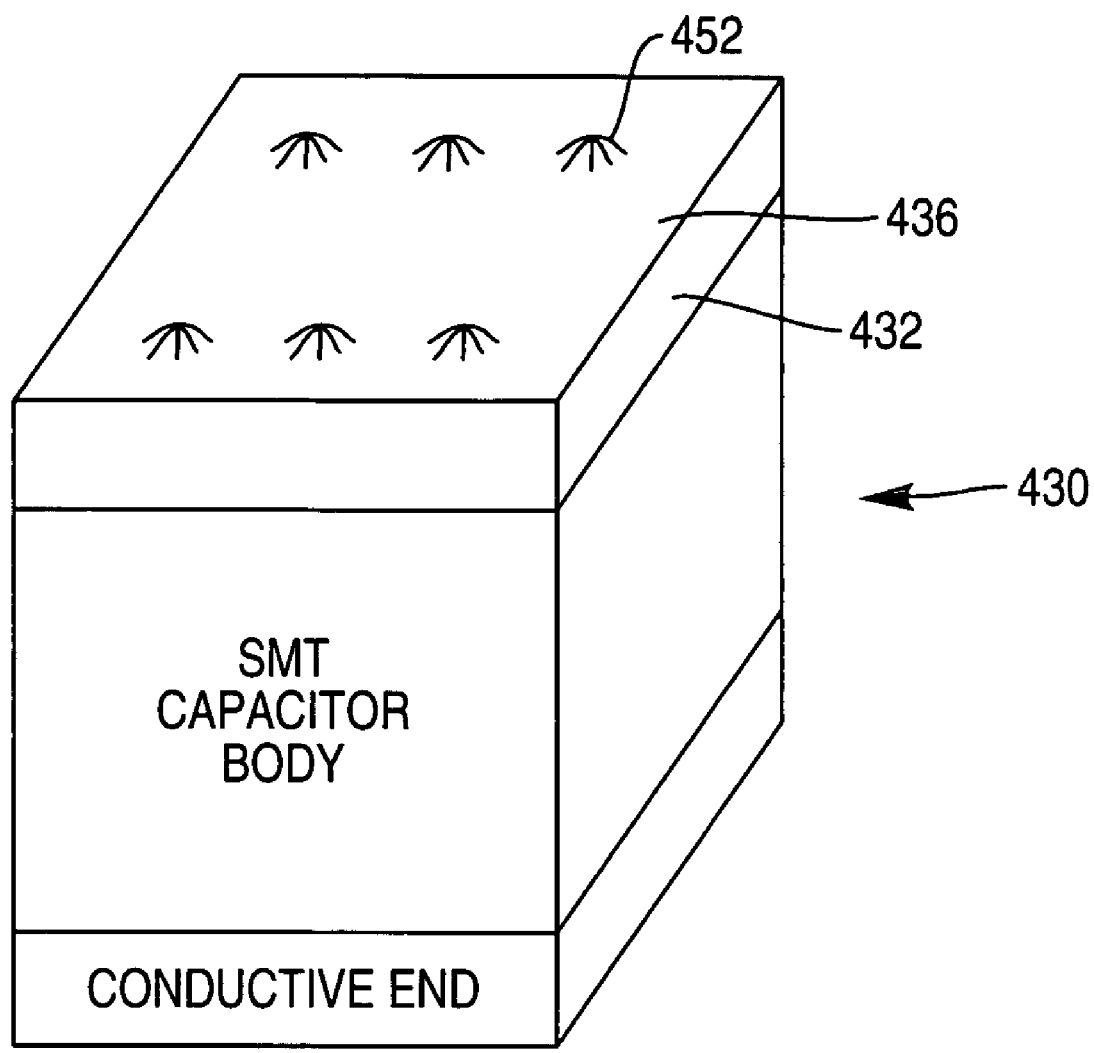

As shown in FIG. 5D, in another arrangement, bumps 452 are formed on the electrode surface 436. A "bump" refers to any raised structure that protrudes from the general surface of the electrode 432. The bumps 452 are deposited onto or otherwise formed on the electrode surface 436.

In other embodiments, other techniques can also be used to roughen the contact surface of a capacitor electrode. For example, such other techniques can be similar to techniques used by manufacturers to roughen an outside surface of a power reference plane foil.

Figure 6:
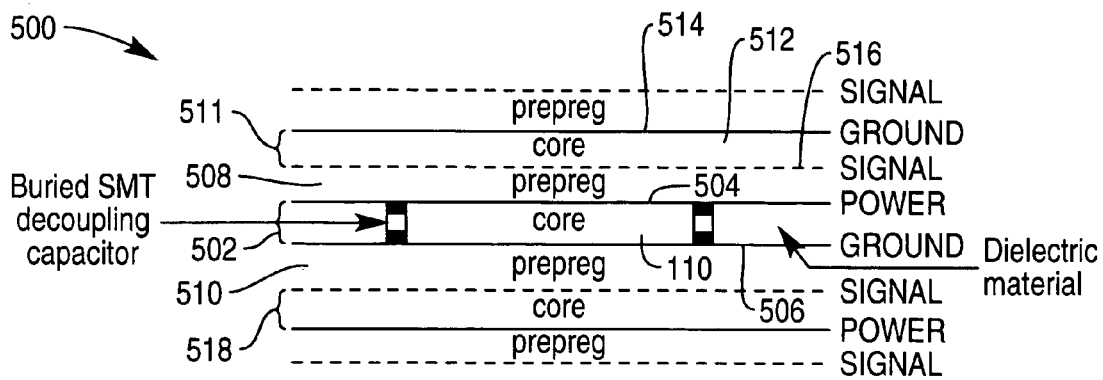
FIGS. 6 and 7 illustrate side views of layers in a circuit board according to two embodiments.

FIG. 6 shows an example arrangement of a multi-layered circuit board that incorporates the core assembly made according to any one of the processes discussed above. The circuit board arrangement 500 of FIG. 6 includes the core assembly 502, which has multiple buried, discrete decoupling capacitors placed in corresponding openings 210 of the dielectric layer 110. One electrically conductive foil 504 is electrically connected to a power supply voltage reference plane, while another electrically conductive foil 506 of the core assembly 502 is electrically connected to a ground reference. In building up the circuit board 500, additional dielectric layers 508 and 510 (referred to as prepreg layers) are provided on the two sides of the core assembly 502). A prepreg layer is an insulator layer that contains a material designed to meet at a predetermined temperature. For example, the prepreg layer includes gas fibers pre-impregnated with epoxy, with the epoxy formulated to melt into liquid form at a predetermined temperature. A core assembly 511 is placed above the prepreg layer 508. The core assembly 511 differs from the core assembly 502 by not including buried decoupling capacitors. The core assembly 511 has a dielectric layer 512 and two electrically conductive foils 514 and 516 provided on the two sides of the dielectric layer 512. In the example arrangement shown in FIG. 6, the electrically conductive foil 514 is connected to a ground reference, and the electrically conductive foil 516 is patterned into a layer of signal wires. A similar core assembly 518 is provided below the prepreg layer 510. Additional prepreg layers and core assemblies are further added to the assembly to form the multi-layered circuit board 500.

Figure 7:
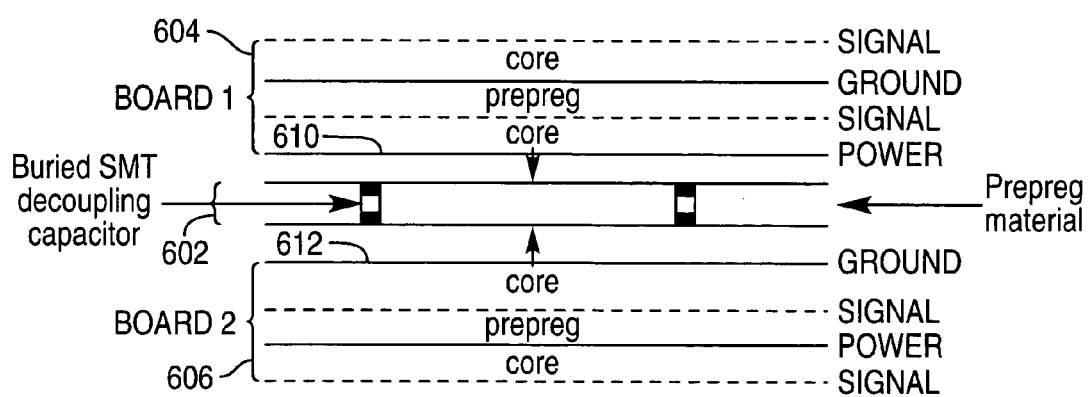

The embodiments discussed above utilize core assemblies each with decoupling capacitors in a dielectric layer along with electrically conductive foils on the two sides of the dielectric layer. In another embodiment, instead of one of the core assemblies discussed above, the discrete decoupling capacitors are provided in a prepreg dielectric layer or any other type of insulator layer (which does not include the electrically conductive foils on the two main surfaces of the insulator layer). As shown in FIG. 7, a multi-layered circuit board 600 includes the modified prepreg layer 602 that has the dielectric layer along with buried decoupling capacitors 608 placed in openings of the dielectric layer. In this alternative embodiment, a first circuit board 604 and a second circuit board 606 are built in a conventional manner. These circuit boards 604 and 608 are then abutted to the two main surfaces of the prepreg layer 602 with the buried capacitors 608. The upper circuit board 604 is placed on one main surface of the prepreg layer 602, while the second circuit board 606 is placed on the other main surface of the prepreg layer 602. After the circuit boards are placed on the two main surfaces of the prepreg layer 602, the whole circuit board 600 is heated to slightly above reflow temperature while pressure is applied to reflow the dielectric of the prepreg layer 602 to bond the prepreg layer 602 to the respective surfaces of the circuit boards 604 and 606. Electrical contact of the power supply voltage reference plane layer 610 and the ground reference plane layer 612 to the electrodes of the capacitor 608 is maintained by compression.

In the various embodiments, discrete, buried decoupling capacitors are provided in openings of a dielectric layer. The benefit offered by such discrete capacitors is that the overall capacitance provided by such capacitors is relatively large. The positions of the buried decoupling capacitors according to the various embodiments avoid the introduction of relatively large inductances (such as inductances associated with standard vias) into electrical paths of connections between electrodes of the decoupling capacitors and a power reference plane, with the relatively large inductances reducing the overall effectiveness of the decoupling capacitors. The larger capacitance offered by the decoupling capacitors over some conventional techniques allows for more effective removal of switching noise, especially at high frequencies.

In yet another embodiment, a different arrangement uses a core assembly in which the buried discrete capacitors are placed not between the power supply voltage plane layer and the ground plane layer, but on outer surfaces of the power supply voltage and ground plane layers. Such an arrangement is shown in FIG. 8, which shows a core assembly 700 that includes power reference plane layers 702 and 704 that are separated by a dielectric layer 706.

In addition, the core assembly 700 includes discrete surface mount capacitors 708 that are placed on the outer surface 710 of the power reference plane layer 702, and discrete capacitors 714 that are placed on the outer surface 716 of the power reference plane layer 704. Each capacitor 708 has electrodes 720 and 724, with electrode 720 electrically connected to the power reference plane layer 702 (e.g., by soldering, wiring, etc.). The other electrode 724 is electrically connected to a via 726 that extends through a via hole 728 through the layers 702, 706, and 704 that are part of the core assembly 700.

Each capacitor 714 also has electrodes 730 and 732, with electrode 730 electrically connected to the power reference plane layer 704. The other electrode 732 is electrically connected to a via 726.

Figure 8:
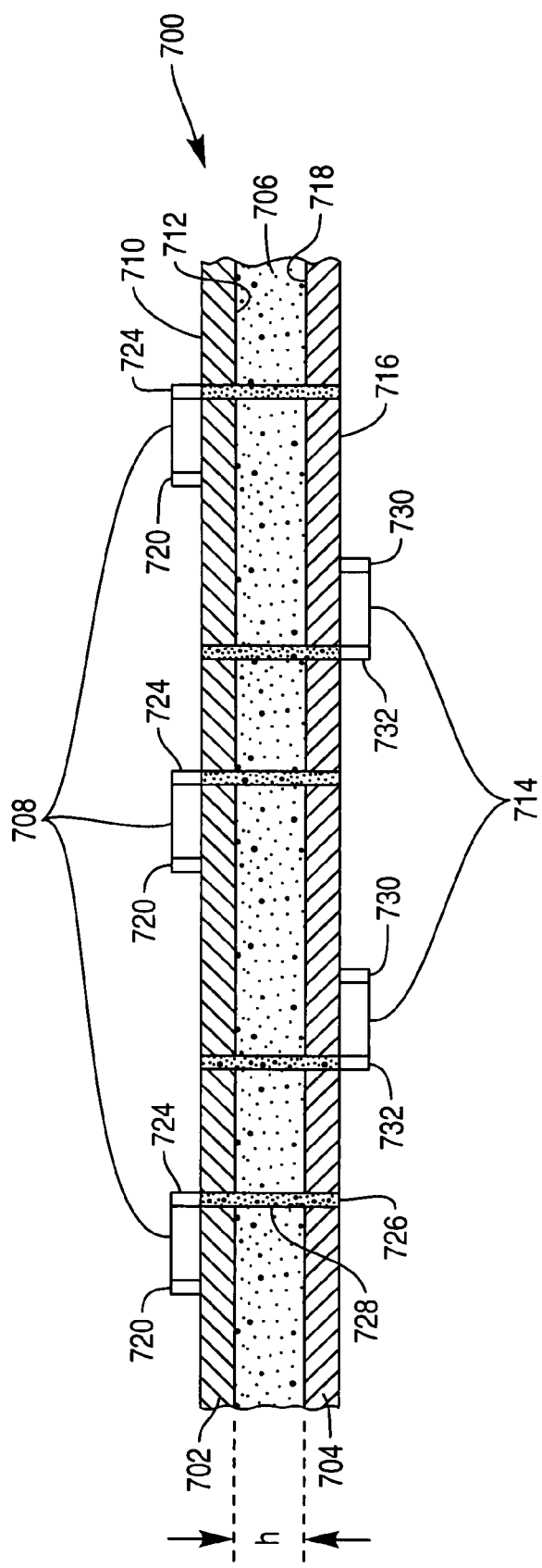
FIG. 8 illustrates a side view of a core assembly according to another embodiment.
Figure 9A:
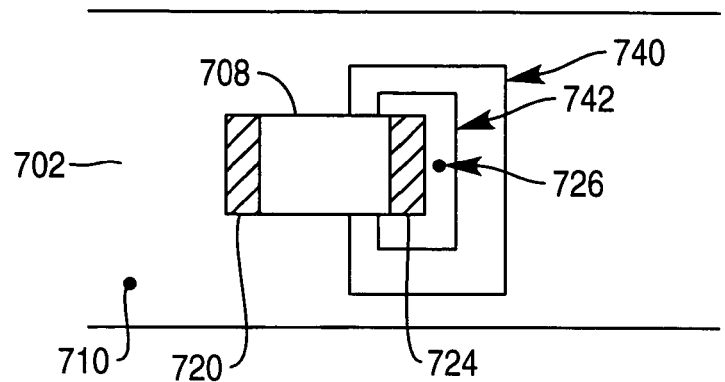
FIG. 9A is a top view of a portion of the core assembly of FIG. 8.

As discussed above, one electrode of each of the capacitors shown in FIG. 8 is electrically connected to the surface of the power reference plane layer on which the capacitor is mounted. However, the other electrode of the capacitor is insulated from, and thus is not electrically connected to, the surface on which the capacitor is mounted. As shown in the top view of FIG. 9A, the electrode 720 of the capacitor 708 is electrically connected (e.g., soldered) to the top surface 710 of the power reference plane layer 702. However, the other electrode 724 of the capacitor 708 is provided in an anti-pad (or clearance) region 740 defined in the power reference plane layer 702. As a result, the electrode 724 is electrically isolated from the power reference plane layer 702.

A pad 742 is defined to provide a region at which the capacitor electrode is to contact the via. The clearance 740 is defined around the pad 742.

Figure 9B:
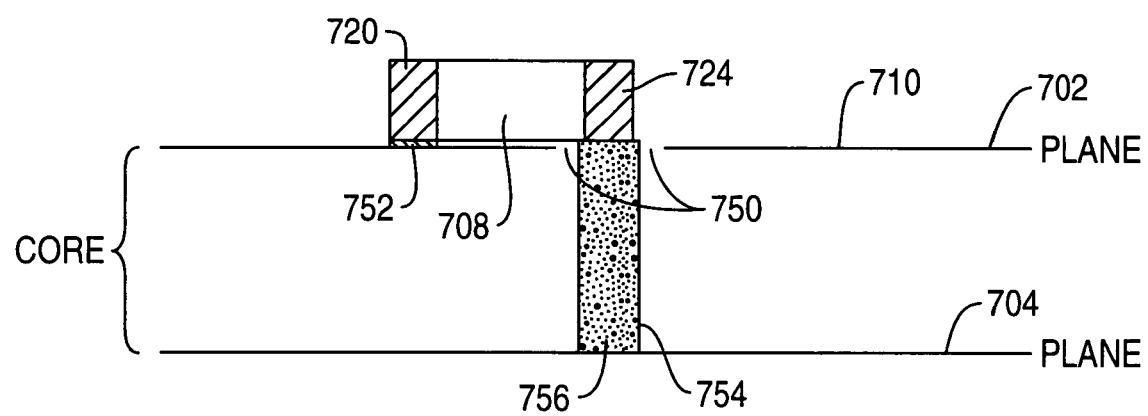
FIG. 9B is a side view of another embodiment.

In a different arrangement, as shown in FIG. 9B, a pad does not need to be defined. A clearance (anti-pad) 750 is defined in the power reference plane layer 702. A hole or void 754 is punched, or drilled, or otherwise formed through the power reference plane layer 702 and the dielectric layer 706. The capacitor 708 is placed such that its electrode 724 is provided over the hole or void 754. The other electrode 720 of the capacitor 708 is soldered at 752 to the upper surface 710 of the power reference plane layer 702.

The circuit is completed when an electrically conductive material, such as electrically conductive epoxy or some other material, is provided to fill the hole or void 754 so that a electrical connection is provided between the capacitor electrode 724 and the power reference plane layer 704. The electrically conductive material forms a via 756.

Note that the hole or void 754 is formed to have a relatively large cross-sectional area (larger than the cross-sectional area of other plated hole vias in the circuit board). As a result, the via 756 has a lower inductance than such other vias. If a punching technique is used to form the hole 754, such a punching technique allows the formation of a hole that is not limited to a circular cross-sectional profile (as would be the case with drilling). Also, punching avoids the need for secondary fabrication steps such as de-burring and plating.

If electrically conductive epoxy or other like material is used to form the via 756, such material is associated with a higher resistance than that offered by a plated via. The increased resistance aids in high-frequency noise mitigation. The overall conductivity (and hence the resistivity) of the epoxy can be tailored by adjusting the percentage of electrically conductive particles mixed into the epoxy.

In the arrangement of FIGS. 8 and 9, vias 726 that extend through two conductive layers and one dielectric layer are employed to electrically connect discrete capacitors 708 and 714 between two power reference plane layers. The vias 726 extend through a relatively small number of layers (or just a dielectric layer) and thus are of relatively short length. Therefore, the vias 726 are associated with relatively small inductances so that the capacitors 708 and 714 are able to provide effective bypass paths for high-frequency switching noise. Each capacitor 708 and 714 only requires via 726 at one electrode of the capacitor, thus maintaining relatively small inductances to provide effective bypass paths for high frequency switching noise.

A benefit offered by the arrangement of FIG. 8 is that the power reference plane layers 702 and 704 (one containing a power supply voltage plane and the other containing a ground plane) can be more closely spaced than in some of the arrangements shown in FIGS. 2, 4, 6, and 7. In those arrangements, discrete capacitors are placed between the power reference plane layers 702 and 704 so that a separation between the power reference plane layers equal to or slightly larger than the thickness of the discrete capacitors is needed. However, with the arrangement of FIG. 8, the discrete capacitors are moved from between the power reference plane layers of the core assembly 700 to the outer surfaces of the power reference plane layers. As a result, the separation (indicated by height "h" in FIG. 8) between the power reference plane layers 702 and 704 can be reduced, particularly as compared to the embodiments of FIGS. 2, 4, 6, and 7 that use relatively large (associated with a large height) discrete capacitors. Placing the power reference plane layers 702 and 704 closer together also helps in reducing effects of switching noise.

As examples, the height h, representing the separation between the power reference plane layers 702 and 704, is made to be less than or equal to 20 mils. In fact, for even better noise performance, the height h is further reduced to less than or equal to 10 mils, 5 mils, or 2 mils.

For the embodiments of FIGS. 2, 4, 6, and 7, the separation of the power reference plane layers that embed the discrete capacitors can be reduced if discrete capacitors of smaller sizes are used.

In the embodiment of FIG. 8, a smaller height h adds a further benefit: the inductance of the via 726 is reduced so that the series inductance in the bypass path that also includes a decoupling capacitor is also reduced.

Figure 10:
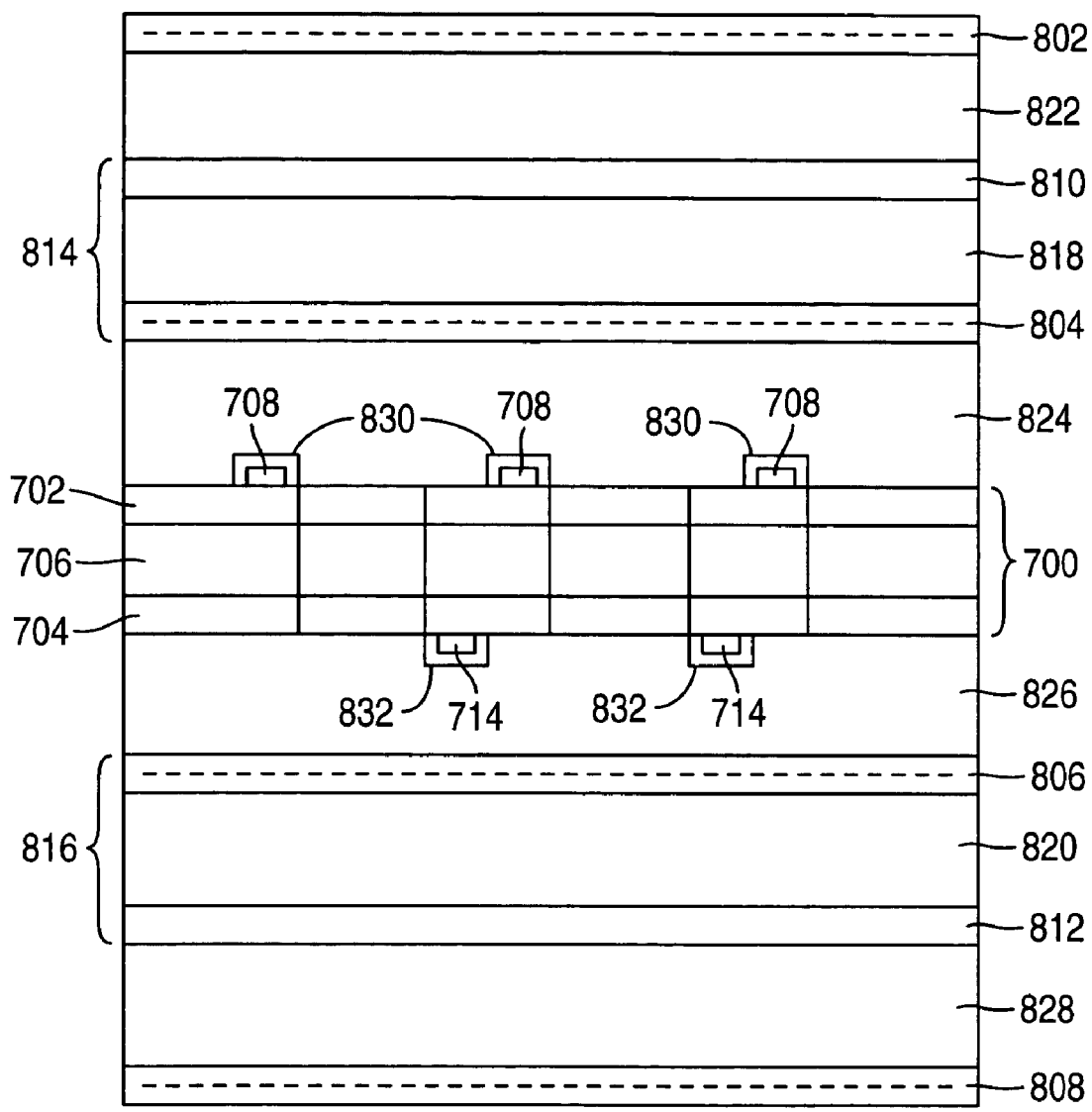
FIG. 10 illustrates a side view of a circuit board that includes the core assembly of FIG. 8.

FIG. 10 shows the core assembly 700 of FIG. 8 embedded between other layers of a circuit board 800. In the example arrangement of FIG. 10, the circuit board 800 also includes core assemblies 814 and 816 (without discrete capacitors) on the two sides of the core assembly 700. The core assembly 814 includes a signal layer 804, a power reference plane layer 810, and a dielectric material 818 between layers 804 and 810. Similarly, the core assembly 816 includes a signal layer 806, a power reference layer 812, and a dielectric layer 820. Other layers of the circuit board 800 include signal layers 802 and 808 and prepreg layers 822, 824, 826, and 828.

If the discrete capacitors 708 and 714 are relatively large, then they may cause high-pressure regions to develop in the abutting prepreg layers 824 and 826 during circuit board fabrication. To alleviate this, depressions or grooves 830 are formed in the surface of the prepreg layer 824 abutting the capacitors 708. The depressions or grooves 830 are formed at locations of the capacitors 708 so that the depressions or grooves 830 receive the capacitors 708 when the prepreg layer 824 is placed over the core assembly 700. Similarly, depressions or grooves 832 are formed in the surface of the prepreg layer 826 abutting the capacitors 714 at the locations of the capacitors 714.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method of forming an assembly for use in a circuit board, comprising:
   providing a dielectric layer;
   forming plural openings in the dielectric layer;
   placing discrete capacitors in the plural openings;
   forming a roughened profile on each electrode of each capacitor;
   abutting a first and a second power reference layers to the respective surfaces of the dielectric layer;
   electrically connecting the first and the second power reference layers to the respective electrodes of the capacitors by contacting the roughened profile of each electrode to the respective power reference layers; and
   compressing the first and the second power reference layers to the respective surfaces of the dielectric layer to maintain electrical contact between the first and the second power reference layers and the capacitors.

2. The method of claim 1, wherein forming the roughened profile comprises performing one of scoring, etching, and dendritic plating.

3. The method of claim 1, wherein forming the roughened profile comprises forming bumps on a surface of each electrode.

\* \* \* \* \*